US007420811B2

(12) United States Patent
Chan

(10) Patent No.: US 7,420,811 B2
(45) Date of Patent: Sep. 2, 2008

(54) HEAT SINK STRUCTURE FOR LIGHT-EMITTING DIODE BASED STREETLAMP

(75) Inventor: Tsung-Wen Chan, 5F-1, No. 31, Sec. 6, Sinyi Rd., Sinyi District, Taipei (TW)

(73) Assignee: Tsung-Wen Chan, Taipei (TW)

( * ) Notice: Subject to any disclaimer, the term of this patent is extended or adjusted under 35 U.S.C. 154(b) by 169 days.

(21) Appl. No.: 11/531,699

(22) Filed: Sep. 14, 2006

(65) Prior Publication Data

US 2008/0068799 A1 Mar. 20, 2008

(51) Int. Cl.
*H05K 7/20* (2006.01)
*F21V 29/00* (2006.01)

(52) U.S. Cl. ....................... 361/709; 361/707; 361/717; 361/720; 361/722; 362/294; 362/345; 362/373

(58) Field of Classification Search ................ 361/709, 361/707, 717, 720, 722; 362/294, 345, 373
See application file for complete search history.

(56) References Cited

U.S. PATENT DOCUMENTS

| | | | | | |
|---|---|---|---|---|---|
| 3,315,072 | A | * | 4/1967 | Harling | 362/329 |
| 4,010,362 | A | * | 3/1977 | Fletcher | 362/375 |
| 4,160,286 | A | * | 7/1979 | Merritt | 362/311 |
| 4,460,945 | A | * | 7/1984 | Chan et al. | 362/294 |
| 4,527,225 | A | * | 7/1985 | Hartman | 362/294 |
| 4,731,551 | A | * | 3/1988 | Gibbs et al. | 307/141 |
| 5,103,137 | A | * | 4/1992 | Blake et al. | 315/119 |
| 5,235,252 | A | * | 8/1993 | Blake | 315/151 |
| 5,615,947 | A | * | 4/1997 | Shambo et al. | 362/376 |
| 5,651,612 | A | * | 7/1997 | Braun | 362/376 |
| 5,823,665 | A | * | 10/1998 | Braun | 362/376 |
| 6,676,279 | B1 | * | 1/2004 | Hubbell et al. | 362/293 |
| 6,948,826 | B2 | * | 9/2005 | Fogerlie | 362/183 |
| 7,198,387 | B1 | * | 4/2007 | Gloisten et al. | 362/294 |
| 2001/0030866 | A1 | * | 10/2001 | Hochstein | 362/294 |
| 2002/0176250 | A1 | * | 11/2002 | Bohler et al. | 362/236 |
| 2004/0095782 | A1 | * | 5/2004 | Isoda | 362/555 |
| 2005/0052870 | A1 | * | 3/2005 | Vamberi | 362/294 |
| 2006/0050507 | A1 | * | 3/2006 | Morrow et al. | 362/227 |
| 2006/0180821 | A1 | * | 8/2006 | Fan et al. | 257/98 |
| 2006/0250803 | A1 | * | 11/2006 | Chen | 362/373 |
| 2007/0247853 | A1 | * | 10/2007 | Dorogi | 362/294 |
| 2008/0055908 | A1 | * | 3/2008 | Wu et al. | 362/294 |

FOREIGN PATENT DOCUMENTS

| | | | | |
|---|---|---|---|---|
| GB | 2439745 | A | * | 1/2008 |
| JP | 2004265626 | A | * | 9/2004 |
| JP | 2007165051 | A | * | 6/2007 |

* cited by examiner

*Primary Examiner*—Anatoly Vortman
(74) *Attorney, Agent, or Firm*—Pai Patent & Trademark Law Firm; Chao-Chang David Pai

(57) ABSTRACT

A heat sink structure for light-emitting diode (LED) based streetlamps is disclosed, which comprises an upper cover, on which heat sink fins are integrally formed, and a lower cover. The heat energy generated by the LEDs mounted within the upper cover and the lower cover can be removed through the heat sink fins, achieving the effect of rapid removal of the heat energy.

8 Claims, 6 Drawing Sheets

HEAT SINK STRUCTURE FOR LIGHT-EMITTING DIODE BASED STREETLAMP

BACKGROUND OF THE INVENTION

1. Field of the Invention

The present invention relates to a heat sink structure for a light-emitting diode (LED) based streetlamp and more particularly to an improved heat sink structure for an LED based streetlamp.

2. Description of the Prior Art

Conventionally, streetlamps are generally in the form of bulbs. However, they are considered having the disadvantages of high power consumption and short lifetime. Recently, light-emitting diode (LED) has been used as a power source for torches. High power LED is a kind of LED which can emit light normally even with a power of only 0.5 to 3 watts supplied. In addition to the torch, such kind of LED has also been used in the headlight. However, the high power LED still can not be effectively used as a backlight source for liquid crystal display (LCD) since the light emitting efficiency thereof is too low therefor. So far, there are still few LEDs for the LCD on the market, since they have to be further developed for practical use.

With development of the LEDs in the recent decade, the high power LEDs have gradually become indispensable in our daily life. Being technically limited by the LED materials and packaging technology, the LEDs still have not lived up to the specifications of the general lighting means in terms of luminance and life span. Further, the heat energy, generated when the LED emits light, has to be properly removed therefrom. If the heat sink mechanism is not properly provided, the high temperature caused by the heat energy will reduce the luminance and life span and shift the light wavelength with respect to the LEDs. In the case of streetlamps, the poor heat sink mechanism also leads to a quick damage thereof.

In view of these problems encountered in the prior art, the Inventors have made many efforts in the related research and finally successfully developed a heat sink structure for LED based streetlamps, as described in the present invention.

SUMMARY OF THE INVENTION

It is, therefore, an object of the present invention to provide a heat sink structure for light-emitting diode (LED) based streetlamps, through which heat energy generated by the LEDs therein can be rapidly removed therefrom.

In accordance with the present invention, the heat sink structure for LED based streetlamps comprises an upper cover, on which a plurality of heat sink fins are integrally formed, and a lower cover. The heat energy generated by the LEDs, mounted on a polymer-coated gold substrate, within the upper cover and the lower cover can be removed through the heat sink fins. Depending on the power specification for the LEDs, the polymer-coated gold substrate may be varied in area and shape. An upper silicon seal and a lower silicon seal are provided in the upper cover and the lower cover, respectively, so that the heat sink structure can be water resistant. A fastening member is disposed between the upper cover and the lower cover so that the two covers are not totally separated from each other when one is moved from the other for maintenance and replacement of elements in the heat sink structure. A rear hole and a lower hole are formed on the upper cover and the lower cover, respectively, for insertion of and fixation to a lamp post. When the lamp post is absent, an upper plug and a lower plug may be used to choke up the rear hole and the lower hole, respectively, so that the heat sink structure is water resistant.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

The present invention discloses a heat sink structure for light-emitting diode (LED) based streetlamps, which will be described with the preferred embodiments in conjunction with the drawings. However, they should be deemed merely illustrative, and not limitative.

Figure 1A:
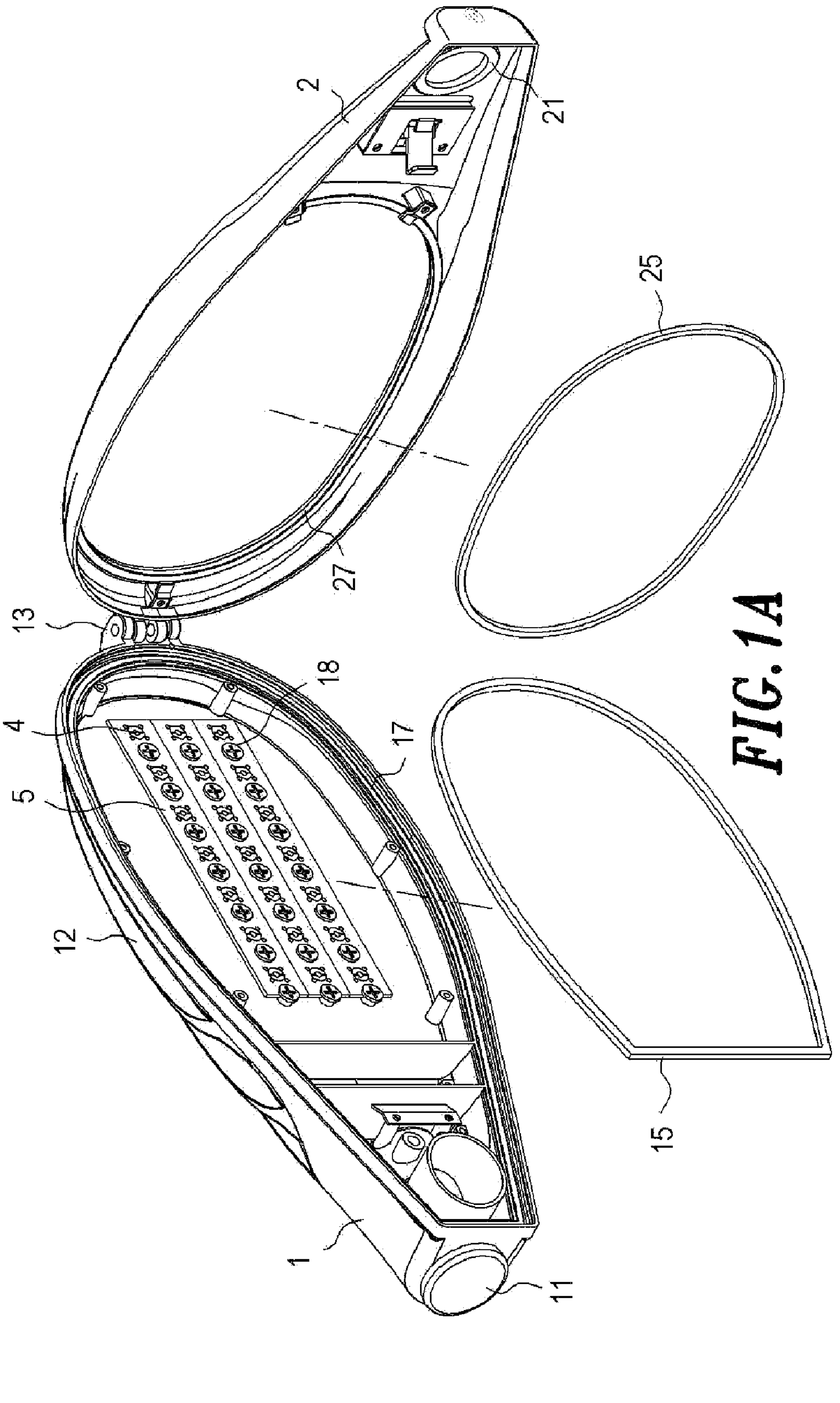
FIG. 1A is an exploded view of a heat sink structure for light-emitting diode (LED) based streetlamps according to an embodiment of the present invention.
Figure 4:
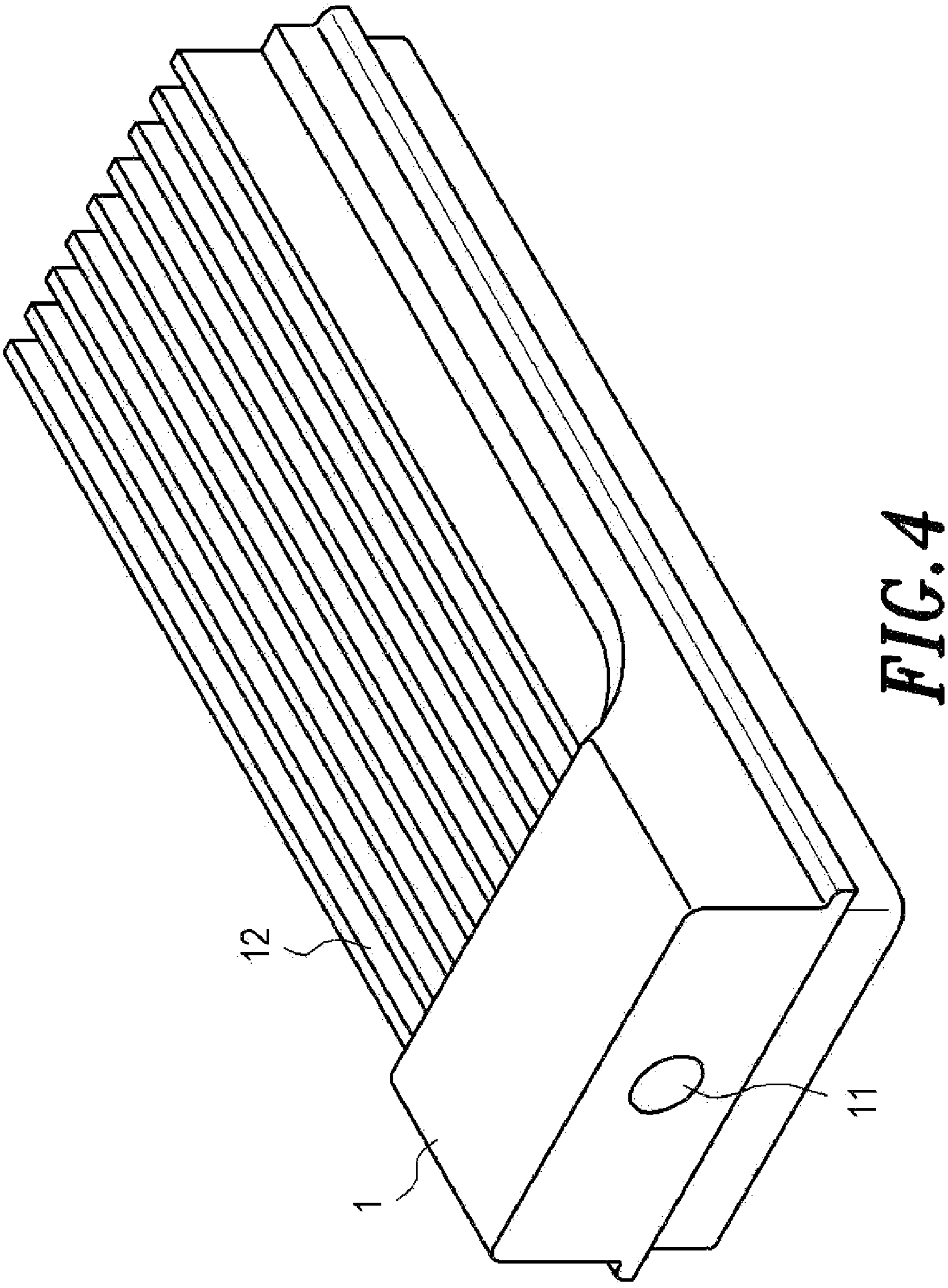
FIG. 4 is a perspective view of the heat sink structure for LED based streetlamps with rectangular upper cover and lower cover.

Referring to FIG. 1A, the heat sink structure for a high power LED based streetlamp according to an embodiment of the present invention is schematically shown therein. The heat sink structure comprises an upper cover 1, a lower cover 2 and a polymer-coated gold substrate 5. Between the upper cover 1 and the lower cover 2, there is a fastening member 13 for fastening the two covers 1, 2 together. The fastening member 13 is disposed on an outer surface of the upper cover 1 at a front end thereof; alternatively, the fastening member 13 may be disposed on an inner surface of the upper cover 1 at a rear end thereof. As such, the upper cover 1 may be moved from the lower cover 2 without being totally separated from the lower cover 2. Referring to FIG. 4, the upper cover 1 and the lower cover 2 are each a rectangular body. On the outer surface of the upper cover 1 at the rear end, a rear hole 11 for fixation to a lamp post is formed. On the outer surface of the lower cover 2 at a lower end, a lower hole 21 for fixation to the lamp post is formed. With the rear hole 11 of the upper cover 1 and the lower hole 21 of the lower cover 2, the heat sink structure can be firmly fixed to a lamp post. Viewed externally, each of the rear hole 11 and the lower hole 21 may take a circular or any other shape.

Figure 2A:
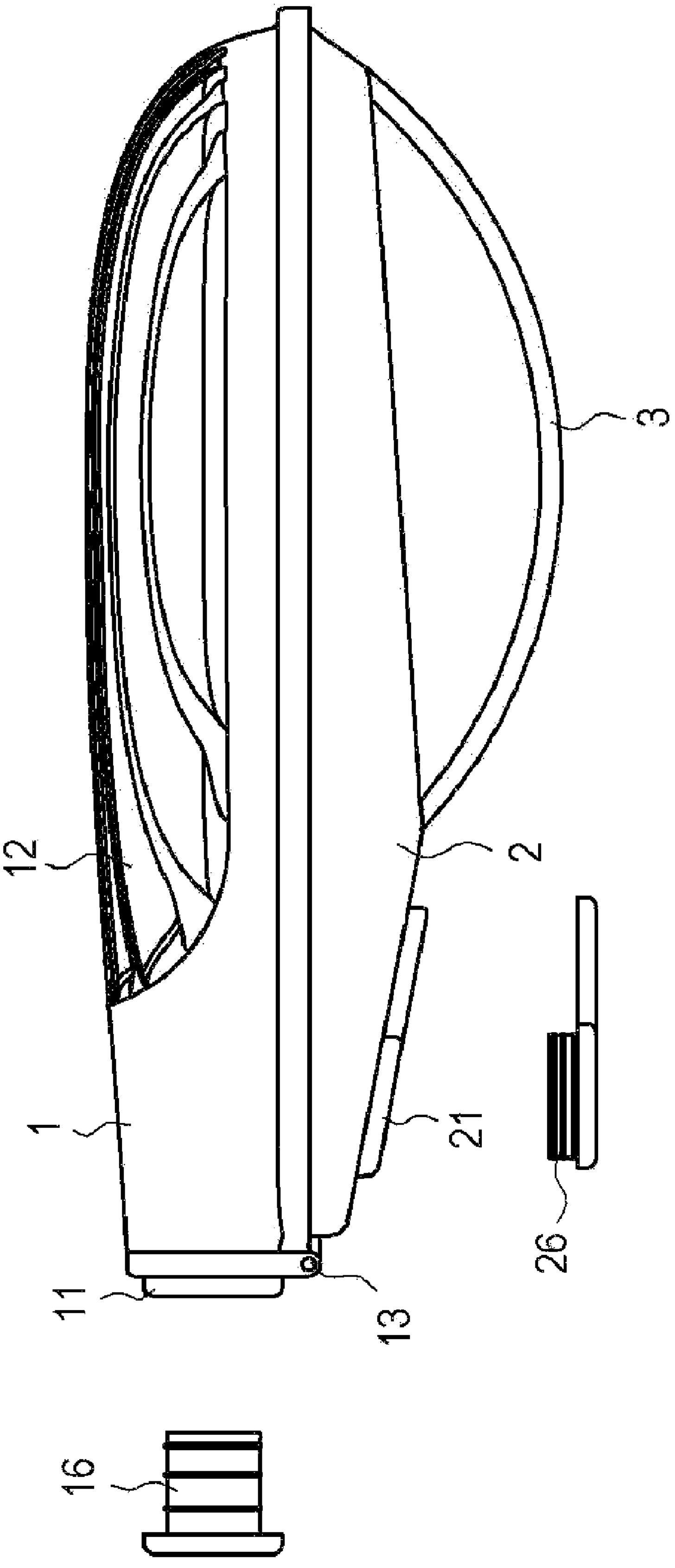
FIG. 2A is a side view of the heat sink structure for LED based streetlamps shown in FIG. 1A.
Figure 2B:
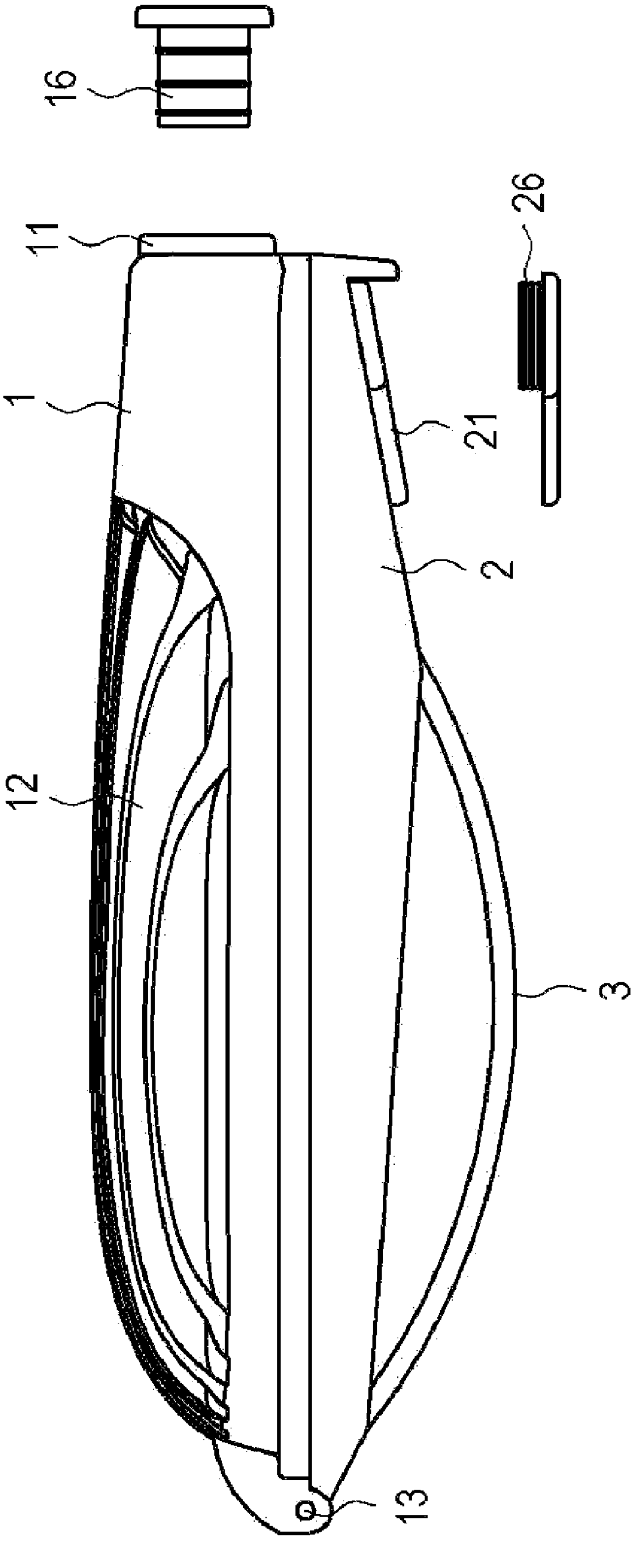
FIG. 2B is a side view of the heat sink structure for LED based streetlamps shown in FIG. 1B.

Referring to FIG. 2A, an upper plug 16 and a lower plug 26 may be used to choke up the rear hole 11 and the lower hole 21 so that the heat sink structure is water resistant. In addition, a lamp mask 3 can be disposed on the outer surface of the lower cover 2.

Figure 1B:
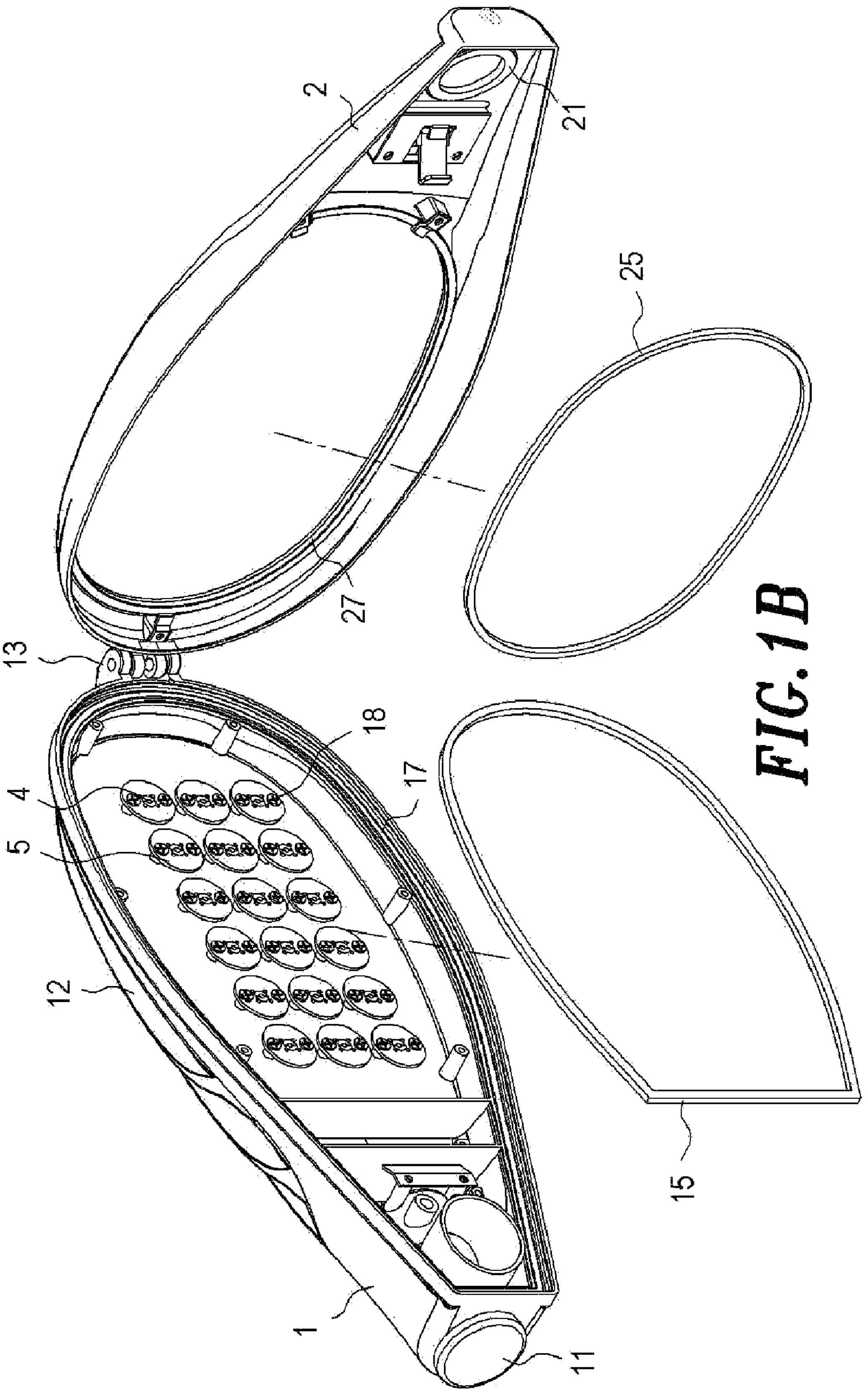
FIG. 1B is an exploded view of the heat sink structure for LED based streetlamps according to another embodiment of the present invention.

Referring again to FIG. 1A, the upper cover 1 and the lower cover 2 have an upper slot 17 and a lower slot 27, respectively. The upper slot 17 is formed at a rim of the inner surface of the upper cover 1. An upper silicon seal 15 may be received within the upper slot 17. The lower slot 27 is formed at a rim of the inner surface of the lower cover 2. A lower silicon seal 25 may be received within the lower slot 27. With the upper slot 17 and the lower slot 27, the heat sink structure is water resistant when the upper cover 1 and the lower cover 2 are assembled together. A plurality of high power LEDs 4 are fixedly mounted on the polymer-coated gold substrate 5. Referring to FIG. 1A and FIG. 1B, the polymer-coated gold substrate 5 may take a rectangular or a circular shape. The polymer-coated gold substrate 5 is fixed on the inner surface of the upper cover 1 by means of a screw 18. In this manner, the heat energy generated by the high power LEDs can be transmitted through the polymer-coated gold substrate 5 to a plurality of heat sink fins 12 and further to the ambient air.

Figure 3:
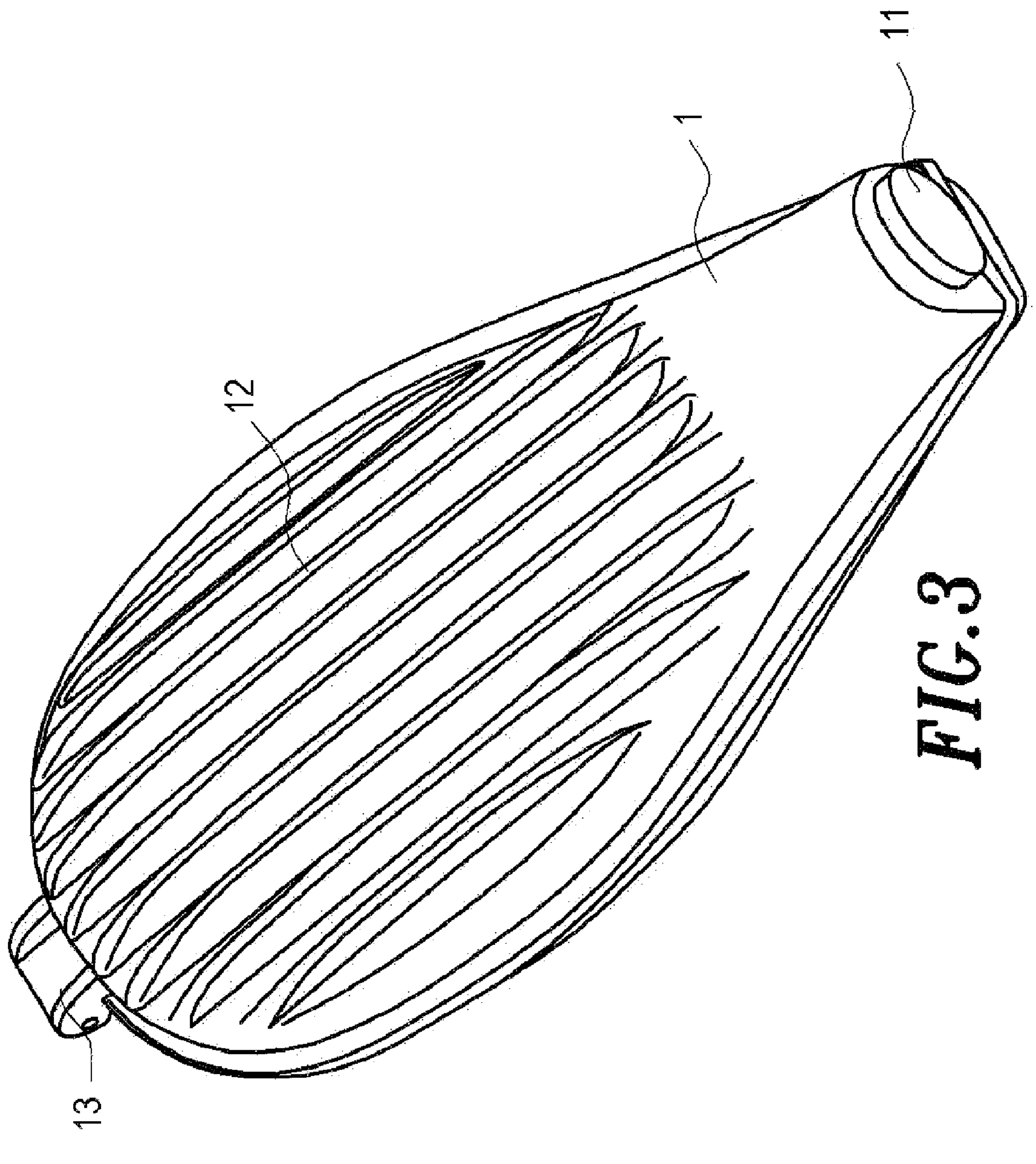
FIG. 3 is a perspective view of the heat sink structure for LED based streetlamps shown in FIG. 1A.

Referring to FIG. 3, the plurality of heat sink fins 12 are integrally formed on the outer surface of the upper cover 1. As such, the heat energy generated by the LEDs 4 can be rapidly removed therefrom. The heat sink fins 12 are preferably made of aluminum, Many changes and modifications in the above described embodiment of the invention can, of course, be carried out without departing from the scope of the invention. Accordingly, to promote the progress in science and the useful arts, the invention is disclosed and is intended to be limited only by the appended claims.

What is claimed is:

1. A heat sink structure for light-emitting diode (LED) based streetlamp, comprising:

an upper cover having an upper outer surface and an upper inner surface and comprising a rear hole on the upper outer surface at a rear end thereof for fixing to a lamp post, an upper slot formed on a rim on the upper inner surface, wherein an upper silicon seal is received in the upper slot and a plurality of heat sink fins are formed on the upper outer surface;

a lower cover having a lower outer surface and a lower inner surface and comprising a lower hole on the lower outer surface at a rear end thereof for fixing to the lamp post and a lower slot formed at a rim of the lower inner surface of the lower cover, wherein a lower silicon seal is received in the lower slot; and a polymer-coated gold substrate disposed within the upper cover, wherein the polymer-coated gold substrate is a printed circuit board (PCB) having a copper material for heat conduction, wherein the upper cover is fastened to the lower cover with a fastening member disposed either at front ends or at rear ends of the upper outer surface and the lower outer surface so that the upper cover and the lower cover will remain attached to each other when one is moved from the other.

2. The heat sink structure as claimed in claim 1, wherein the rear hole is choked up with an upper plug when the heat sink structure is not fixed to a lamp post.

3. The heat sink structure as claimed in claim 1, wherein the lower hole is choked up with a lower plug when the heat sink structure is not fixed to a lamp post.

4. The heat sink structure as claimed in claim 1, wherein a plurality of LEDs are fixedly mounted on the polymer-coated gold substrate.

5. The heat sink structure as claimed in claim 1, wherein the polymer-coated gold substrate has a rectangular shape.

6. The heat sink structure as claimed in claim 1, wherein the polymer-coated gold substrate has a circular shape.

7. The heat sink structure as claimed in claim 1, wherein each of the upper cover and the lower cover has a circular shape.

8. The heat sink structure as claimed in claim 1, wherein each of the upper cover and the lower cover has a rectangular shape.

* * * * *